US009558969B2

(12) United States Patent
Seigeot

(10) Patent No.: US 9,558,969 B2
(45) Date of Patent: Jan. 31, 2017

(54) METHOD AND DEVICE FOR PUMPING OF A PROCESS CHAMBER

(71) Applicant: ADIXEN VACUUM PRODUCTS, Annecy (FR)

(72) Inventor: Bertrand Seigeot, Dingy Saint Clair (FR)

(73) Assignee: ADIXEN VACUUM PRODUCTS, Annecy (FR)

( * ) Notice: Subject to any disclaimer, the term of this patent is extended or adjusted under 35 U.S.C. 154(b) by 123 days.

(21) Appl. No.: 14/415,025

(22) PCT Filed: Jul. 15, 2013

(86) PCT No.: PCT/EP2013/064929

§ 371 (c)(1),
(2) Date: Jan. 15, 2015

(87) PCT Pub. No.: WO2014/012896

PCT Pub. Date: Jan. 23, 2014

(65) Prior Publication Data

US 2015/0170938 A1 Jun. 18, 2015

(30) Foreign Application Priority Data

Jul. 19, 2012 (FR) ..................................... 12 02049

(51) Int. Cl.
*F04B 49/00* (2006.01)
*H01L 21/67* (2006.01)
(Continued)

(52) U.S. Cl.
CPC ....... *H01L 21/67011* (2013.01); *B08B 9/0321* (2013.01); *F04B 37/14* (2013.01);
(Continued)

(58) Field of Classification Search
CPC .. H01L 21/67011; B08B 9/0321; F04B 37/14; F04C 18/126; F04C 23/003; F04C 23/006; F04C 28/02; F04C 28/24; F04C 29/0092; F04C 29/0014; F04C 2220/30; Y10T 137/4259; B04C 5/04; B04C 5/13; F04F 5/20
See application file for complete search history.

(56) References Cited

U.S. PATENT DOCUMENTS 4,995,794 A * 2/1991 Wycliffe ................ F04C 25/02 417/423.2
5,312,466 A 5/1994 Taberlet et al.
(Continued)

FOREIGN PATENT DOCUMENTS

FR 2 691 382 A1 11/1993
FR 2 952 683 A1 5/2011
WO 2005/071509 A1 8/2005

OTHER PUBLICATIONS

International Search Report for PCT/EP2013/064929 dated Mar. 27, 2014.

*Primary Examiner* — Jessica Cahill
(74) *Attorney, Agent, or Firm* — Sughrue Mion, PLLC

(57) ABSTRACT

A pumping device intended to be connected to a process chamber (2) includes a dry primary vacuum pump, an auxiliary pump mounted so that the auxiliary pump bypasses a check valve on the vacuum pump, a first valve device connected to a purging device for purging the dry primary vacuum pump and intended to be connected to a gas supply, a second valve device mounted so that the second valve device bypasses a check valve upstream from the auxiliary pump, and a controller configured to control the first and second valve devices on the basis of an operating status of the process chamber in such a way that the first valve device is at least partially closed and the second valve device is
(Continued)

open when the process chamber is operating at ultimate vacuum. Also a method for pumping of a process chamber by way of such a pumping device.

13 Claims, 4 Drawing Sheets

(51) Int. Cl.

| | |
|---|---|
| ***F04B 37/14*** | (2006.01) |
| ***F04C 23/00*** | (2006.01) |
| ***F04C 25/02*** | (2006.01) |
| ***F04C 28/02*** | (2006.01) |
| ***F04F 5/20*** | (2006.01) |
| ***B08B 9/032*** | (2006.01) |
| ***F04C 18/12*** | (2006.01) |
| ***F04C 28/24*** | (2006.01) |
| *F04C 29/00* | (2006.01) |

(52) U.S. Cl.

CPC .......... *F04C 18/126* (2013.01); *F04C 23/003* (2013.01); *F04C 23/006* (2013.01); *F04C 25/02* (2013.01); *F04C 28/02* (2013.01); *F04C 28/24* (2013.01); *F04C 29/0092* (2013.01); *F04F 5/20* (2013.01); *F04C 29/0014* (2013.01); *F04C 2220/30* (2013.01); *Y10T 137/4259* (2015.04)

(56) References Cited

U.S. PATENT DOCUMENTS

| | | | | |
|---|---|---|---|---|
| 5,356,275 | A * | 10/1994 | Brenner ................ | F04C 23/001 137/597 |
| 8,047,817 | B2 * | 11/2011 | Manson .................. | F04C 25/00 417/431 |
| 2007/0172361 | A1 * | 7/2007 | Manson .................. | F04C 25/00 417/53 |
| 2012/0219443 | A1 | 8/2012 | Neel | |
| 2013/0019900 | A1 * | 1/2013 | Ehrmann ................ | F04C 25/02 134/18 |

* cited by examiner 2
7a
7b
1
14
Vacuum
Limit
Status
7
11
5a
5
10d
10e
8
3
10a
9
10b
10c
12
F
6a
13
6
4
4a 2
7a
7b
1
5a
5a
5
14
5a
10d
11
10e
10a
9
10c
10b
12
F
6a
13
6
4
4a 15
15
15
21
21
18c
18b
18a
17
21
16
21
22
15
18c
21
18b
15
18a
15

15
15
21
18c
18b
21
18a
17
21
16
21
22
15
18c
21
18b
15
21
18a 15
21
21
18c
18b
21
18a
17
16
21
22
15
18c
21
18b
21
18a

METHOD AND DEVICE FOR PUMPING OF A PROCESS CHAMBER

CROSS REFERENCE TO RELATED APPLICATIONS

This application is a National Stage of International Application No.

PCT/EP2013/064929 filed Jul. 15, 2013, claiming priority based on French Patent Application No. 1202049 filed Jul. 19, 2012, the contents of all of which are incorporated herein by reference in their entirety.

TECHNICAL FIELD

The present invention relates to a pumping device comprising a dry primary vacuum pump for pumping a processing chamber, such as a processing chamber of a tool for fabricating semiconductors. The present invention also relates to a method for pumping by means of said pumping device.

PRIOR ART

Semiconductor substrate processing steps are carried out at low pressures in a processing chamber by means of a pumping device provided with a dry primary vacuum pump.

A step carried out prior to the introduction of gases into the chamber for the processing of a substrate consists in checking the low-pressure threshold attainable in operation, called the "vacuum limit". Obtaining a low-pressure vacuum limit in the processing chamber is a simple, rapid and inexpensive way of checking the seal tightness of the chamber, for example after maintenance, or of checking that the chamber does not contain any gas residues which, if they comprise oxygen or water vapor in too large an amount for example, may be sources of contamination of the substrate.

The vacuum-limit pressure level required by tool manufacturers is generally about $10^{-3}$ or $10^{-2}$ mbar. Such levels are very different from the processing pressures of the substrates processed in the processing chamber, conventionally between $10^{-1}$ and a few hundred of mbar.

To guarantee that such vacuum limit pressures and such processing pressures one or two orders of magnitude higher can be obtained, one known means consists in increasing the number of pumping stages in the dry primary vacuum pumps so that they comprise for example six or seven stages, or in reducing the operating clearances of the pumps, thereby, in both cases, increasing their cost and tending to reduce their reliability.

Other pumping devices propose to arrange a single-stage roots vacuum pump upstream of the conventional dry primary vacuum pump. However, these pumping devices are also expensive.

Yet others propose to arrange an auxiliary vacuum pump at the exhaust of the conventional dry primary vacuum pump. The auxiliary vacuum pump allows the performance of the pumping device to be improved in vacuum limit operation. Nevertheless, the auxiliary pumps consume a non-negligible amount of electrical power and the vacuum limit operating pressure may prove to be insufficient.

SUMMARY OF THE INVENTION

One of the aims of the present invention is to provide a pumping device that allows a low vacuum limit operating pressure and satisfactory pumping speeds, for the low-pressure processing of substrates, to be obtained easily and inexpensively.

For this purpose, one subject of the invention is a pumping device intended to be connected to a processing chamber, comprising:

- a dry primary vacuum pump having:
  - an inlet and an outlet,
  - at least one pumping stage arranged between the inlet and the outlet,
  - a purging means configured to inject a purging gas into said pumping stage,
  - an exhaust duct connected to the outlet, and
  - an anti-return valve arranged in the exhaust duct;
- an ejector mounted on a line bypassing the anti-return valve, the ejector comprising:
  - a duct having a suction orifice, an exhaust orifice, and at least one inlet nozzle; and
  - a means for injecting motive gas for controlling the injection of a motive gas into at least one inlet nozzle; and
- a first valve-comprising device connected to the purging means of the dry primary vacuum pump and intended to be connected to a gas supply.

The first valve-comprising device connected to the purging means is also connected to the means for injecting motive gas and is configured to switch, at least partially, the gas supply from the purging means of the dry primary vacuum pump to the means for injecting motive gas of the ejector.

Another subject of the invention is a method for pumping a processing chamber by means of a pumping device such as described above and connected to a processing chamber, in which the gas supply to the purging means of the dry primary vacuum pump is decreased and the pressure in the exhaust duct connected to the outlet of the dry primary vacuum pump is reduced by starting up the ejector when the processing chamber is in vacuum limit operation, the means for injecting motive gas of the ejector being supplied with gas from the purging means of the dry primary vacuum pump.

According to one or more features of the pumping device or of the pumping method, whether taken individually or in combination:

- the pumping device comprises a second valve-comprising device mounted on a line bypassing the anti-return valve upstream of the ejector;
- the pumping device comprises a controlling means configured to control the first and second valve-comprising devices depending on an operating state of the processing chamber so that the first valve-comprising device is at least partially closed and the second valve-comprising device is open when the processing chamber is in vacuum limit operation;
- when the processing chamber is in vacuum limit operation, the flow rate of the gas supply of the purging means is between 20 and 200 sccm (or 33 and 333 Pa·l/s);
- the first valve-comprising device comprises a three-way solenoid valve;
- the ejector is a multistage ejector;
- the first valve-comprising device comprises at least one solenoid valve controllable by the controlling means;
- the dry primary vacuum pump comprises a plurality of pumping stages, the purging means comprises a plurality of branches for distributing the purging gas to each of the pumping stages, and the first valve-comprising device comprises a plurality of solenoid valves, each solenoid valve being arranged in a respective branch;

the controlling means is configured to at least partially close those solenoid valves of the first valve-comprising device that are associated with pumping stages other than the first pumping stage and to open the solenoid valve of the first valve-comprising device of the first pumping stage when the processing chamber is in vacuum limit operation;

the second valve-comprising device comprises a solenoid valve controllable by the controlling means;

the power supply of the solenoid valve is connected to a switch of the processing chamber; and/or the second valve-comprising device comprises a calibrated anti-return valve that opens when the ejector is started up, the controlling means being configured to start up the ejector depending on the operating state of the processing chamber.

Decreasing the flow rate of purging gas through the pumping stages of the dry primary vacuum pump and reducing the pressure at the outlet of the dry primary vacuum pump allows a very low vacuum limit pressure to be obtained in the processing chamber.

It is possible to decrease the flow rate of purging gas through the pumping stages of the dry primary vacuum pump when the processing chamber is in vacuum limit operation because no gas that could potentially contaminate the vacuum pump is introduced into the processing chamber.

The reduction in the pressure at the outlet of the dry primary vacuum pump in addition allows the electrical power consumption of the primary vacuum pump to be substantially decreased.

To further decrease power consumption, provision may be made to start up the ejector only when the processing chamber is in vacuum limit operation.

Moreover, using an ejector as the auxiliary pumping means allows the pressure at the outlet of the dry primary vacuum pump to be reduced without using moving parts, by virtue of the expansion of the motive gas, therefore without consuming electrical power and in a way involving neither wear nor maintenance, which is not the case for example of a diaphragm or piston pump. In addition, ejectors have the advantage of being very compact so that the pumping device can preserve a low bulk. Also, they withstand well corrosion or attack by aggressive gases, thereby making the pumping device very reliable. Furthermore, ejectors are inexpensive.

The pressure at the outlet of the dry primary vacuum pump is judiciously reduced using an ejector by supplying the means for injecting motive gas with the gas from the purging means of the dry primary vacuum pump. Thus the availability of a compressed, generally to between two and three bar, purging gas which is no longer being used to supply the purging means of the dry primary vacuum pump is exploited to supply the ejector with motive gas.

BRIEF DESCRIPTION OF THE DRAWINGS

Other features and advantages of the present invention will become apparent on reading the description given by way of nonlimiting illustration and the drawings, in which.

DETAILED DESCRIPTION

The expression "vacuum limit" is defined to mean an operating state of the processing chamber in which no gas flow is introduced into the processing chamber, with the exception of possible and negligible parasitic gas flows, for example flows due to degassing from the walls or due to leaks, the processing chamber being pumped to vacuum by the operating pumping device.

Figure 1:
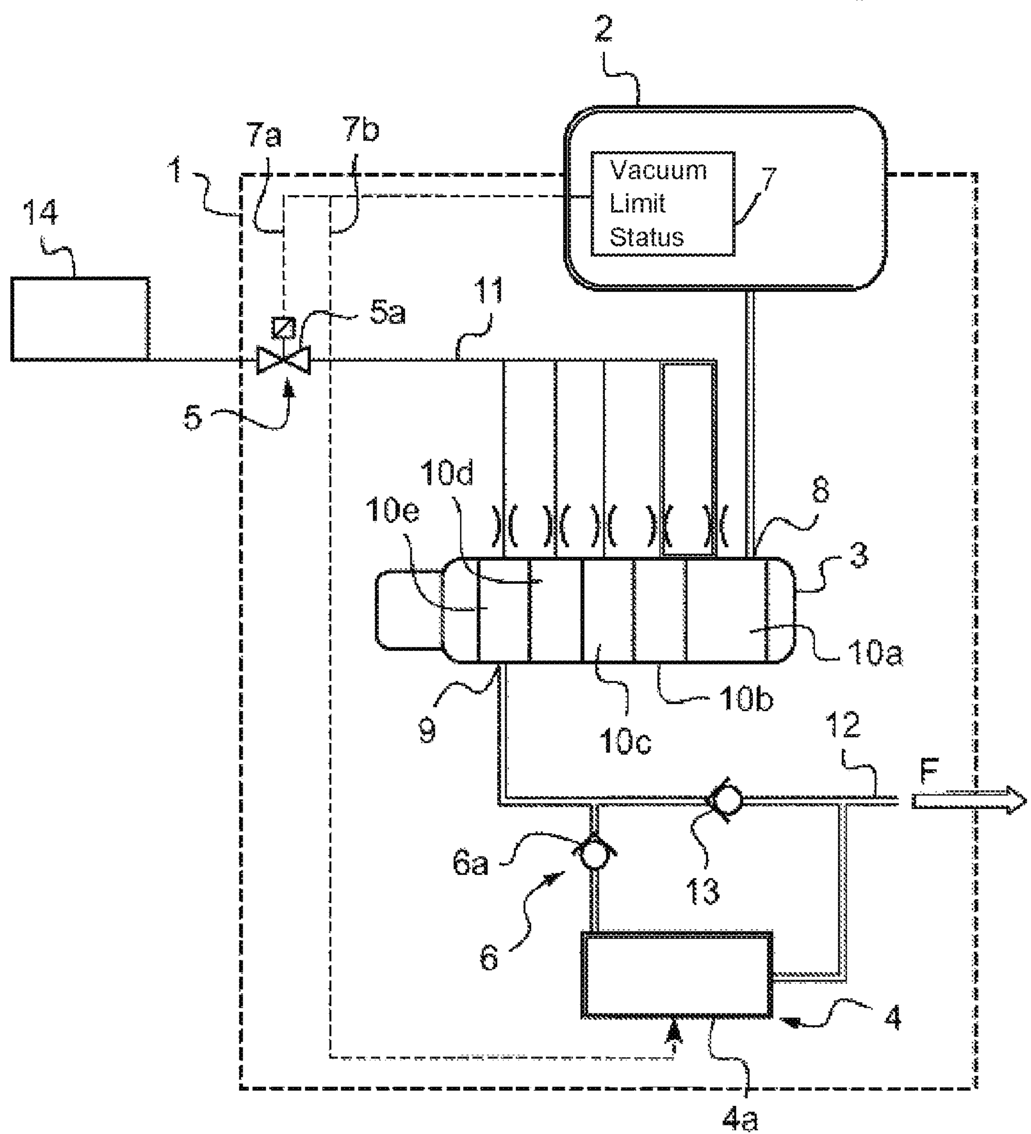
FIG. 1 schematically illustrates a pumping device according to a first embodiment, connected to a processing chamber.

FIG. 1 shows a pumping device 1 for pumping a processing chamber 2 of a tool for fabricating semiconductors. The process implemented in the chamber is for example a metal organic chemical vapor deposition (MOCVD) process, which is a chemical vapor phase deposition process, especially one allowing a GaN active layer to be deposited on an LED (light-emitting diode) substrate. The gases introduced into the processing chamber 2 during processing of the substrate comprise TMG (trimethylgallium) $NH_3$ and $H_2$, for which the process gas flow rates are between 50 and 250 slm (i.e. between 83 333 Pa·l/s and 41 666 Pa·l/s) and the process pressures are between 100 and 500 mbar.

The processing chamber 2 comprises a means for signaling it is in vacuum limit operation, indicating that no process gas is being introduced into the processing chamber 2 and that the latter is being pumped to vacuum by the pumping device 1. This signal of vacuum limit operation is for example an electrical signal, such as provided by the electrical contact obtained by turning on a switch.

As may be seen in FIG. 1, the pumping device 1 comprises a dry primary vacuum pump 3, an auxiliary pumping means 4, a first and a second valve-comprising device 5, 6 and a controlling means 7 configured to supply a vacuum status signal on lines 7*a* and 7*b* to control the first and second valve-comprising devices 5, 6 depending on an operating state of the processing chamber 2.

The dry primary vacuum pump 3 comprises an inlet 8, an outlet 9, at least one pumping stage arranged between the inlet 8 and the outlet 9, a purging means 11, an exhaust duct 12 connected to the outlet 9 of the vacuum pump 3 and an anti-return valve 13 arranged in the exhaust duct 12. The inlet 8 of the vacuum pump 3 is connected to the outlet of the processing chamber 2.

The dry primary vacuum pump 3 is for example a multistage roots vacuum pump and comprises a plurality of pumping stages, five in this example: 10*a*, 10*b*, 10*c*, 10*d*, 10*e*. The inlet of the first pumping stage 10*a* corresponds to the inlet 8 of the vacuum pump 3. This first pumping stage 10*a* is generally called the low-pressure stage. The last pumping stage 10*e* opens onto the outlet 9 of the vacuum pump 3 which exhausts to atmospheric pressure. This last pumping stage 10*e* is generally called the high-pressure stage. Interstage channels connect the pumping stages 10*a*, 10*b*, 10*c*, 10*d*, 10*e* in series one after the other. More precisely, the interstage channels connect the outlet of the preceding pumping stage to the input of the following stage, between the inlet 8 and the outlet 9 of the vacuum pump 3.

The purging means 11 is configured to inject a purging gas, such as nitrogen, into the pumping stages 10*a*, 10*b*, 10*c*, 10*d*, 10*e*. The purging means 11 comprises a distributor also called a “clarinet”, comprising as many branches as the vacuum pump 3 comprises pumping stages, in order to distribute the purging gas from a gas supply 14 to each of the five pumping stages 10*a*, 10*b*, 10*c*, 10*d*, 10*e*. Injection from the purging means 11 is in general carried out at a number of points distributed along the pumping stages 10*a*, 10*b*, 10*c*, 10*d*, 10*e* through nozzles opening onto the exhaust of the associated pumping stage. In the first and last pumping stages 10*a*, 10*e*, the purging gas is, for example, injected level with the bearings of the vacuum pump 3. The flow rate of the purging gas is for example between 35 and 100 slm (i.e. between 58 333 Pa·l/s and 166 666 Pa·l/s).

The purging gas allows the gases coming from the processing chamber 2 to be diluted, especially in order to guarantee conformity with operating clearances between the stator and the rotors, and between the lobes of the rotors of the dry primary vacuum pump 3.

The anti-return valve 13 of the vacuum pump 3 allows the gas to be forced to flow in the pumping direction (see arrow F in FIG. 1) from the processing chamber 2 toward the exhaust duct 12 and thus prevents the return of the gas pumped into the vacuum pump 3. In operation, the vacuum pump 3 pumps the processing chamber 2 to a low pressure by compressing gases and delivering them to the exhaust duct 12 through the anti-return valve 13. When the outlet pressure of the vacuum pump 3 is lower than the exhaust pressure, the anti-return valve 13 closes. Thus the return of atmosphere into the outlet 9 is prevented.

The first valve-comprising device 5 is interposed between the purging means 11 of the dry primary vacuum pump 3 and the gas supply 14 to which it is connected.

The controlling means may be a computer, a microcontroller or a controller equipped with a program tasked with controlling the elements of the pumping device in order to execute the steps of the method. It is configured to at least partially close the first valve-comprising device 5 when the processing chamber is in vacuum limit operation.

According to a first example, in a closed position, the first valve-comprising device 5 completely cuts off the gas flow between the gas supply 14 and the purging means 11, thus cutting off the gas supply to the purging means 11 of at least one pumping stage 10*a*, 10*b*, 10*c*, 10*d*, 10*e*.

According to another example, in an almost closed position, the first valve-comprising device 5 considerably decreases the gas supply 14 to the purging means 11 of at least one pumping stage 10*a*, 10*b*, 10*c*, 10*d*, 10*e*. Thus, the flow rate of the gas supply 14 to the purging means 11, i.e. about 35 to 100 slm, is decreased in vacuum limit operation to a flow rate between 20 and 200 sccm (i.e. between 33 and 333 Pa·l/s).

The residual flow of purging gas that the first valve-comprising device 5 lets pass is therefore negligible relative to the flow of purging gas required to dilute the process gases. This residual flow of purging gas, permanently delivered by the gas supply 14, imparts a flow direction on the gases in the purging means 11 thereby preventing the accumulation of potential corrosive gas residues coming from the processing chamber 2 in the purging means 11.

The first valve-comprising device 5 comprises, for example, at least one solenoid valve 5*a* interposed between the purging means 11 of the dry primary vacuum pump 3 and the gas supply 14.

A means for controlling the solenoid valve 5*a* may for example be obtained by electrically connecting its power supply. The power supply of the solenoid valve 5*a* is, for example, connected to a switch of the processing chamber 2 via a first wire 7*a*. When the processing chamber 2 is in vacuum limit operation, the switch is turned on and cuts off the power supply to the solenoid valve 5*a* causing it to close, thereby decreasing or completely cutting off the gas supply to the purging means 11 of the dry primary vacuum pump 3.

Other embodiments of the means for controlling the solenoid valve 5*a* may of course be envisaged, for example the pneumatic supply of the solenoid valve 5*a* may be electrically connected and controlled.

In the first embodiment in FIG. 1, the first valve-comprising device 5 is arranged on a common line of the distributor of the purging means 11 connecting all the branches of the dry primary vacuum pump 3. It thus decreases or cuts off the gas supply 14 to all the pumping stages 10*a*, 10*b*, 10*c*, 10*d*, 10*e* at the same time.

Figure 2:
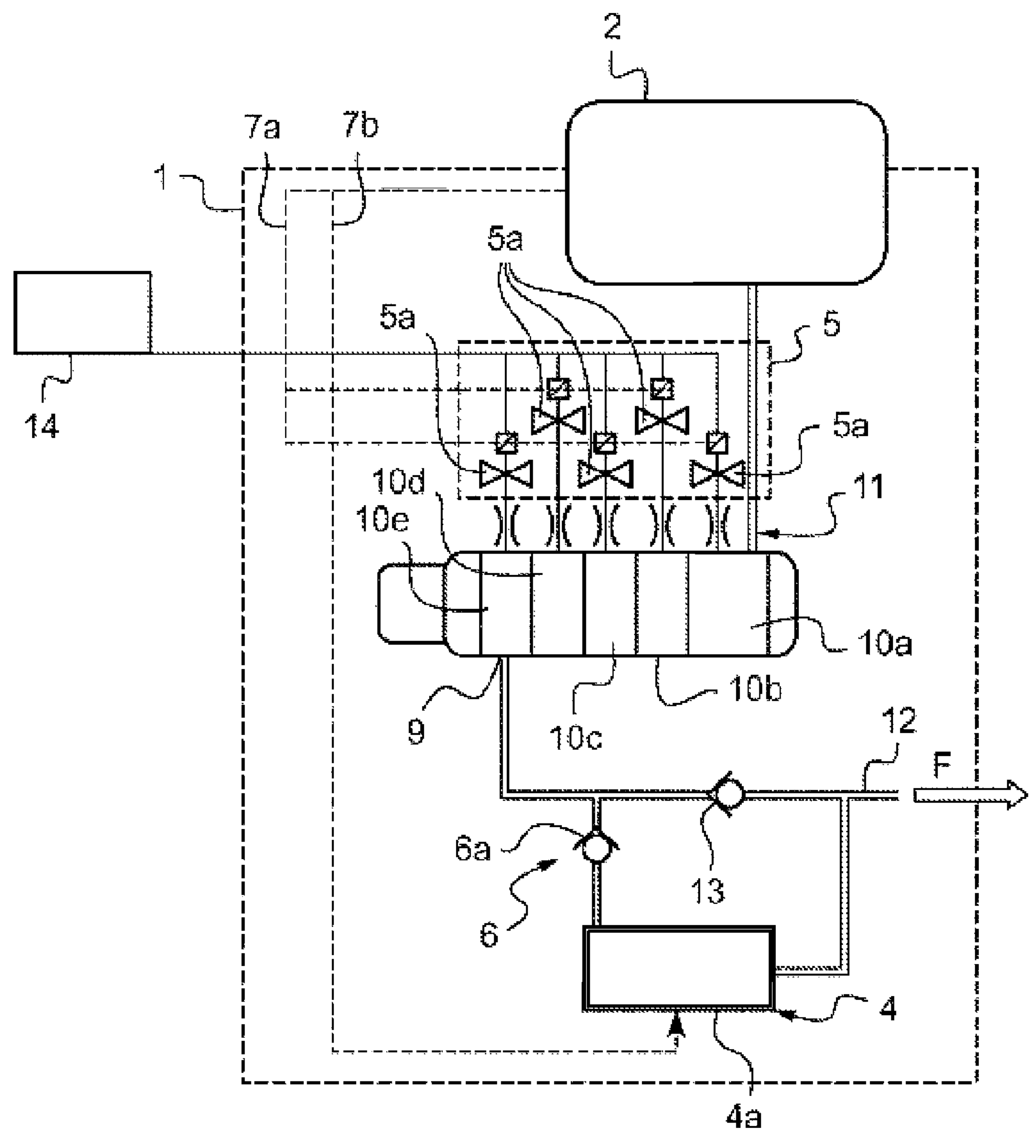
FIG. 2 schematically illustrates a pumping device according to a second embodiment.

In another embodiment, shown in FIG. 2, the first valve-comprising device 5 is configured to selectively supply the pumping stages 10*a*, 10*b*, 10*c*, 10*d*, 10*e* with purging gas. For example, the first valve-comprising device 5 comprises as many solenoid valves 5*a* as the purging means 11 comprises branches, each solenoid valve 5*a* being arranged in a respective branch of the purging means 11 in order to selectively decrease or cut off the gas supply 14 to one or more pumping stages 10*a*, 10*b*, 10*c*, 10*d*, 10*e* at the same time.

The controlling means is for example configured to at least partially close those solenoid valves 5*a* of the first valve-comprising device 5 that are associated with the pumping stages 10*b*, 10*c*, 10*d*, 10*e* other than the first pumping stage 10*a* and to open the solenoid valve 5*a* of the first valve-comprising device 5 of the first pumping stage 10*a* when the processing chamber 2 is in vacuum limit operation. The flow of purging gas to the pumping stages 10*b*, 10*c*, 10*d*, 10*e* other than the first pumping stage 10*a* is thus decreased or cut-off whereas a flow of purging gas is preserved through the low-pressure pumping stage 10*a*. This purging flow allows a minimal protection of the pumping stages of the vacuum pump 3 to be ensured.

The controlling means is also configured to open the second valve-comprising device 6 when the processing chamber 2 is in vacuum limit operation.

As may be seen in FIGS. 1 and 2, the auxiliary pumping means 4 of the pumping device 1 is mounted on a line bypassing the anti-return valve 13 of the vacuum pump 3.

The second valve-comprising device 6 is mounted on a line bypassing the anti-return valve 13, in series with the auxiliary pumping means 4 and upstream of the latter.

When the processing chamber 2 is not in vacuum limit operation, the second valve-comprising device 6 is closed and isolates the inlet of the auxiliary pumping means 4 from the exhaust duct 12, and the first valve-comprising device 5 is open and gas is supplied to the means for purging the pumping stages 10*a*, 10*b*, 10*c*, 10*d* and 10*e*.

In response to the signal that the processing chamber 2 is in vacuum limit operation, the second valve-comprising device 6 is opened and the first valve-comprising device 5 is at least partially closed, cutting off or reducing the gas supply to the purging means 11 of the dry primary vacuum pump 3 and bringing the auxiliary pumping means 4 into fluid communication with the exhaust duct 12.

The decrease in the flow rate of purging gas through the pumping stages of the dry primary vacuum pump 3 and the reduction in the pressure at the outlet 9 of the dry primary vacuum pump 3 allow a very low suction pressure at the inlet 8 of the dry primary vacuum pump 3, and therefore a very low vacuum-limit pressure in the processing chamber 2, to be obtained. It is thus possible to decrease the pressure limit in the processing chamber 2 by a factor of ten.

To reduce power consumption, it is in addition possible to only start up the auxiliary pumping means 4 when the processing chamber 2 is in vacuum limit operation.

According to a first embodiment shown in FIG. 1, the second valve-comprising device 6 comprises a calibrated anti-return valve 6*a* that opens when the auxiliary pumping means 4 is started up. The controlling means is configured to start up the auxiliary pumping means 4 when the processing chamber 2 is in vacuum limit operation.

The auxiliary pumping means 4 is, for example, started up as soon as it is supplied with electrical power. The power supply of the auxiliary pumping means 4 is then, for example, connected to the signaling means of the processing chamber 2 by a second electrical wire 7*b*.

The auxiliary pumping means 4 is for example a diaphragm pump 4*a*.

When closed the anti-return valve 6*a* isolates the inlet of the auxiliary pumping means 4 from the exhaust duct 12. In response to the processing chamber 2 reaching vacuum limit operation an electrical switch is turned on causing the auxiliary pumping means 4 to be supplied with power and therefore to start up. The anti-return valve 6*a* automatically opens when the auxiliary pumping means 4 starts up, the vacuum created downstream of the anti-return valve 6*a* making it to open.

The controlling means of the first valve-comprising device 6 is thus an automatic means requiring no electrical connection to the processing chamber 2.

Figure 3:
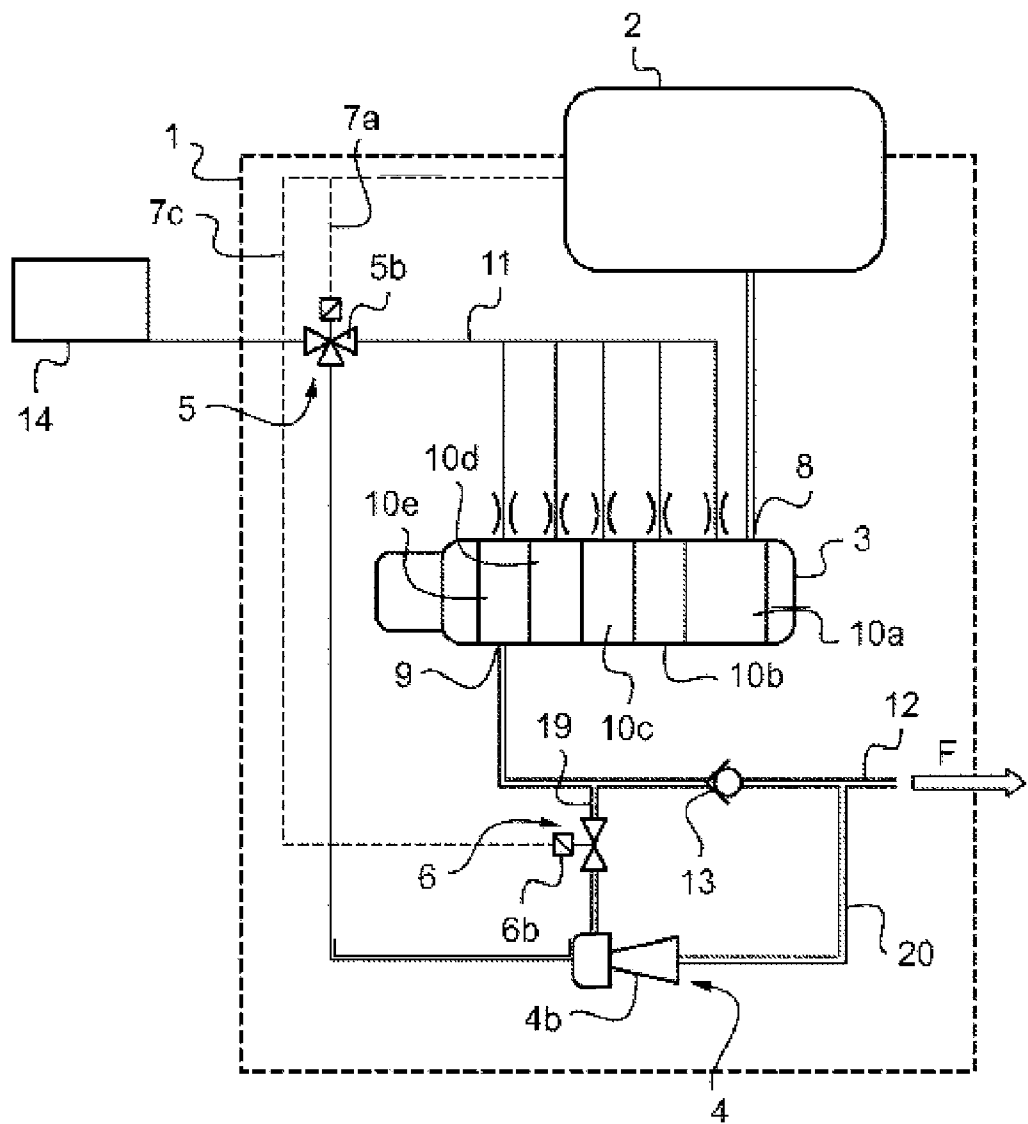
FIG. 3 schematically shows a pumping device according to a third embodiment.

In the embodiment in FIG. 3, the controlling means of the second valve-comprising device 6 comprises a solenoid valve 6*b*.

The controlling means is configured to open the solenoid valve 6*b* of the second valve-comprising device 6 when the processing chamber 2 is in vacuum limit operation, thus bringing the auxiliary pumping means 4 into communication with the exhaust duct 12.

For example, the power supply of the solenoid valve 6*b* is connected to the signaling means of the processing chamber 2 by a third electrical wire 7*c*. Turn-on of the switch of the signaling means of the processing chamber 2 then allows the solenoid valve 6*b* to be supplied with power causing it to open.

In a third embodiment shown in FIG. 3, the auxiliary pumping means 4 comprises an ejector 4*b*.

The ejector 4*b* comprises a duct 22 and a motive gas injecting means.

Figure 4A:
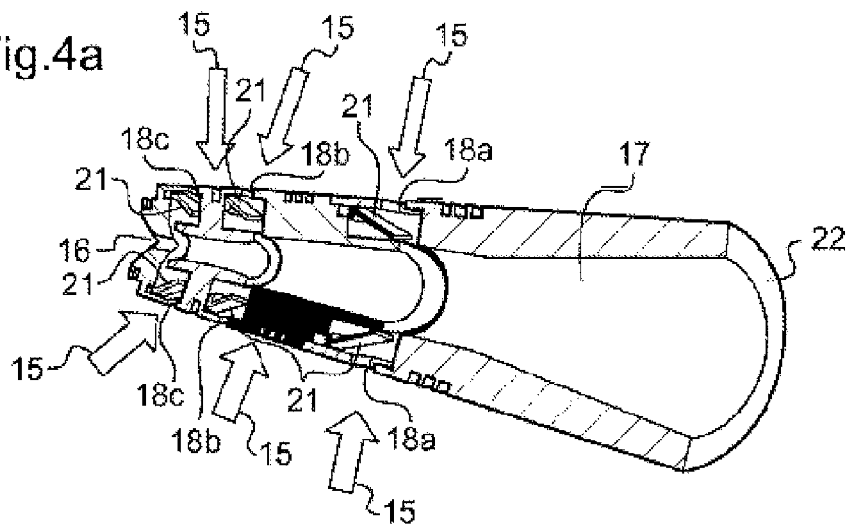
FIG. 4*a* schematically shows a multistage ejector in operation in a first pumping phase, in which a motive gas is injected into all the stages of the ejector.
Figure 4B:
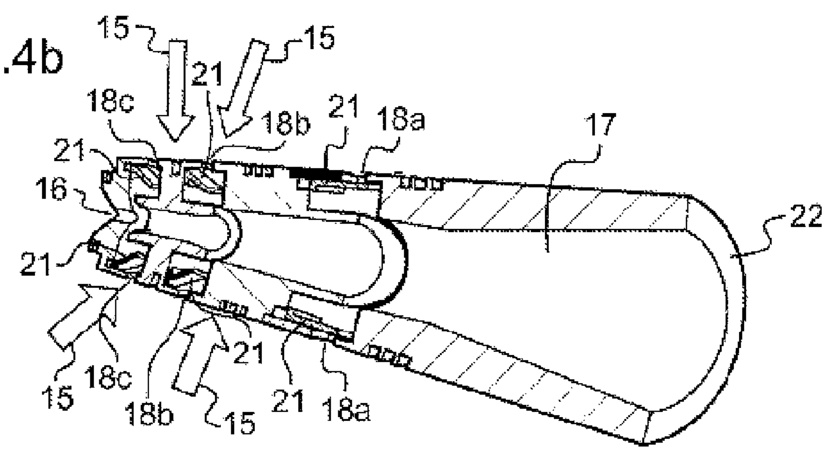
FIG. 4*b* schematically shows a multistage ejector in operation in a second pumping phase, in which a motive gas is injected into two stages of the ejector.
Figure 4C:
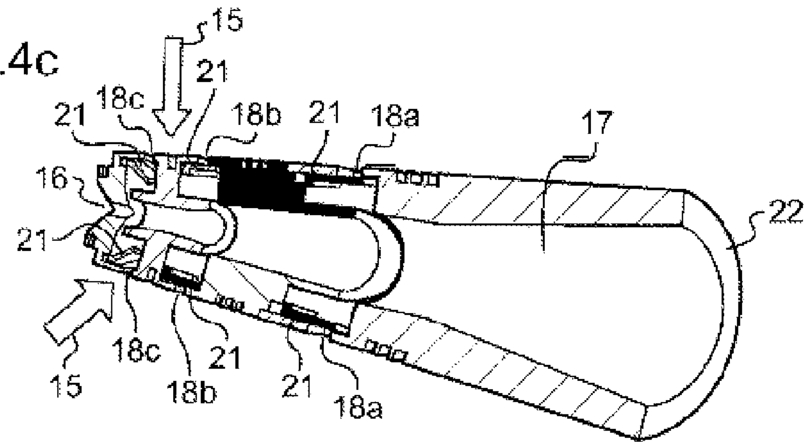
FIG. 4*c* schematically shows a multistage ejector in operation in a third pumping phase, in which a motive gas is injected into a single stage of the ejector.

As may be more clearly seen in FIGS. 4*a*, 4*b* and 4*c*, the duct 22 comprises a suction orifice 16, an exhaust orifice 17 and at least one inlet nozzle 18*a*, 18*b*, 18*c* opening onto the interior space of the duct 22. The suction orifice 16 and the exhaust orifice 17 are connected to the exhaust duct 12 by first and second channels 19, 20 (FIG. 3), respectively. The means for injecting motive gas is configured to control injection of a pressurized motive gas, at high speed, into at least one inlet nozzle 18*a*, 18*b*, 18*c*.

In the example illustrated, the ejector 4*b* is a multistage ejector, i.e. it comprises a number of inlet nozzles 18*a*, 18*b*, 18*c*, distributed along the duct 22 between the suction orifice 16 and the exhaust orifice 17, defining a number of stages. The ejector 4*b* for example comprises three stages, each stage being defined by two mutually facing inlet nozzles 18*a*, 18*b*, 18*c*. The inlet nozzles 18*a*, 18*b*, 18*c* are for example regularly distributed in pairs along the duct 22. Depending on the required pressure and flow rate, the motive gas is injected into none, one, or more than one stage(s) of the ejector 4*b*. Simultaneous activation of a number of stages, by motive gas injection, allows the pumping rate of the ejector 4*b* to be increased. The ejector 4*b* also comprises a valve 21, for example a pivoting valve, associated with each inlet nozzle 18*a*, 18*b*, 18*c*, in order to block said inlet nozzle when no motive gas is being injected.

An ejector is a pumping means the operation of which is based on the Venturi effect: a consequence of fluid dynamics whereby gaseous particles or liquids are accelerated by a constriction in flow cross section, suction being created at the channel throat. Suction is created in each stage by passing compressed gas through the inlet nozzles 18*a*, 18*b*, 18*c*.

The means for injecting motive gas comprises a motive gas distribution network 15 for selectively injecting a motive gas into each inlet nozzle 18*a*, 18*b*, 18*c*. The means for injecting motive gas may selectively control injection of motive gas into none, one or a number of ejector stages 4*b*.

In the example in FIG. 4*a*, the means for injecting motive gas controls injection of motive gas into all the ejector stages 4*b* whereas in FIG. 4*b* the means for injecting gas controls injection of motive gas into only the last two stages of the ejector 4*b*, then only into the last stage of the ejector 4*b* in FIG. 4*c*.

When the processing chamber 2 is in vacuum limit operation, the controlling means at least partially closes the first valve-comprising device 5 and opens the second valve-comprising device 6 bringing the ejector 4*b* into fluid communication with the exhaust duct 12.

Decreasing or cutting off gas flow through the purging means of the dry primary vacuum pump 3 and reducing the outlet pressure 9 of the dry primary vacuum pump 3 allow the threshold of the pressure limit in the processing chamber 2 to be reduced.

Moreover, using an ejector 4*b* as the auxiliary pumping means 4 allows the pressure at the outlet 9 of the dry primary vacuum pump 3 to be reduced without using moving parts, by virtue of the expansion of the motive gas, therefore without consuming electrical power and in a way involving neither wear nor maintenance, which is not the case for example of a diaphragm or piston pump.

In addition, ejectors have the advantage of being very compact so that the pumping device can preserve a low bulk. Also, they withstand well corrosion or attack by aggressive gases, thereby making the pumping device very reliable. Furthermore, ejectors are inexpensive.

To decrease power consumption, provision may be made to start up the ejector 4*b* only when the processing chamber 2 is in vacuum limit operation.

This may be judiciously achieved by supplying the means for injecting motive gas of the ejector 4*b* with the gas from the purging means 11 of the dry primary vacuum pump 3. Thus the availability of a compressed, generally to between two and three bar, purging gas which is virtually no longer being used to supply the purging means 11 of the dry primary vacuum pump 3 is exploited to supply the ejector 4*b* with motive gas.

To do this, the first valve-comprising device 5 is also connected to the means for injecting motive gas of the ejector 4*b* and the first valve-comprising device 5 is configured to switch the gas supply 14 of the purging means 11 of the dry primary vacuum pump 3 to the means for injecting motive gas of the ejector 4*b*.

For example, the first valve-comprising device 5 comprises two two-way solenoid valves. A first solenoid valve comprises a first port connected to the purging means 11 of the dry primary vacuum pump 3 and a second port connected to the gas supply 14. A second solenoid valve comprises a first port connected to the means for injecting motive gas of the ejector 4*b* and a second port connected to the gas supply 14.

A means for controlling the first valve-comprising device 5 may for example be obtained by electrically connecting its solenoid valves.

In a second embodiment, the first valve-comprising device 5 comprises a three-way valve 5*b*, such as a three-way solenoid valve, a first port being connected to the purging means 11 of the dry primary vacuum pump 3, a second port being connected to the gas supply 14, and a third port being connected to the means for injecting motive gas of the ejector 4*b*. Thus, control of the switch of the gas supply 14 from the dry primary vacuum pump 3 to the means for injecting motive gas of the ejector 4*b*, is simplified.

The second valve-comprising device 6 may comprise a calibrated anti-return valve 6*a* that automatically opens when the ejector 4*b* is started up. The controlling means is configured to start up the ejector 4*b*, i.e. to inject the motive gas into at least one inlet nozzle 18*a*, 18*b*, 18*c*, when the processing chamber 2 is in vacuum limit operation.

Alternatively, the second valve-comprising device 6 may comprise a solenoid valve 6*b* (FIG. 3).

Moreover, the second valve-comprising device 6 may be configured to open when a signal is received indicating the processing chamber 2 is in vacuum limit operation, and to close after a preset length of time, for example about three seconds. The means for injecting motive gas is then controlled to inject motive gas for a very short length of time on the basis of the signal from the processing chamber 2 indicating it is in vacuum limit operation. Specifically, the pressure decrease caused by the start-up of the ejector 4*b* may last indefinitely provided that the pumping line is in vacuum limit operation and is not supplied with a new gas flow. Occasional supply of motive gas, for a short length of time, to the ejector 4*b* allows nitrogen consumption to be further optimized.

Thus, when the second valve-comprising device 6 is closed, no motive gas is injected, the valves 21 are closed and isolate the interior space of the duct 22 of the ejector 4*b*.

When the processing chamber 2 is in vacuum limit operation, the controlling means at least partially closes the first valve-comprising device 5 and switches the supply of purging gas to one or more inlets 18*a*, 18*b*, 18*c* of the ejector 4*b*.

The associated valve 21 opens allowing the motive gas to penetrate into the ejector 4*b*, thereby producing a pressure drop in the duct 22 in communication with the exhaust duct 12 and therefore a drop in the outlet pressure 9 of the vacuum pump 3.

The pumping device 1 therefore allows a low vacuum limit pressure and satisfactory pumping speeds, for the low-pressure processing of substrates, to be obtained easily and inexpensively.

The invention claimed is:

1. A pumping device intended to be connected to a processing chamber, comprising:

a dry primary vacuum pump having:

an inlet and an outlet, at least one pumping stage arranged between the inlet and the outlet, a purging means configured to inject a purging gas into said pumping stage, an exhaust duct connected to the outlet, and an anti-return valve arranged in the exhaust duct;

an ejector mounted on a line bypassing the anti-return valve, the ejector comprising:

a duct having a suction orifice, an exhaust orifice, and at least one inlet nozzle; and a means for injecting motive gas for controlling the injection of a motive gas into at least one inlet nozzle; and a first valve-comprising device connected to the purging means of the dry primary vacuum pump and intended to be connected to a gas supply, characterized in that the first valve-comprising device connected to the purging means is also connected to the means for injecting motive gas and is configured to switch, at least partially, the gas supply from the purging means of the dry primary vacuum pump to the means for injecting motive gas of the ejector.

2. A pumping device according to claim 1, characterized in that the pumping device comprises a second valve-comprising device mounted on a line bypassing the anti-return valve upstream of the ejector and a controlling means configured to control the first and second valve-comprising devices depending on an operating state of the processing chamber.

3. A pumping device according to claim 1, characterized in that the first valve-comprising device comprises a three-way solenoid valve.

4. A pumping device according to claim 1, characterized in that the ejector is a multistage ejector.

5. A pumping device according to claim 1, characterized in that the pumping device comprises a second valve-comprising device mounted on a line bypassing the anti-return valve upstream of the ejector and a controlling means configured to control the first and second valve-comprising devices depending on an operating state of the processing chamber, and further characterized in that the second valve-comprising device comprises a solenoid valve controllable by the controlling means.

6. A pumping device according to claim 1, characterized in that the pumping device comprises a second valve-comprising device mounted on a line bypassing the anti-return valve upstream of the ejector and a controlling means configured to control the first and second valve-comprising devices depending on an operating state of the processing chamber, and further characterized in that the second valve-comprising device comprises a calibrated anti-return valve that opens when the ejector is started up.

7. A pumping device according to claim 1, characterized in that the first valve-comprising device comprises at least one solenoid valve controllable by a controlling means configured to control the first valve-comprising device depending on an operating state of the processing chamber.

8. A pumping device according to claim 7, characterized in that the power supply of the solenoid valve is connected to a switch of the processing chamber.

9. A pumping device according to claim 7, in which the dry primary vacuum pump comprises a plurality of pumping stages, the purging means comprises a plurality of branches for distributing the purging gas to each of the pumping stages, and the first valve-comprising device comprises a plurality of solenoid valves, each solenoid valve being arranged in a respective branch.

10. A pumping device according to claim 9, characterized in that the pumping device comprises a second valve-comprising device mounted on a line bypassing the anti-return valve upstream of the ejector and said controlling means is configured to control both the first and second valve-comprising devices depending on an operating state of the processing chamber, and further characterized in that the controlling means is configured to at least partially close those solenoid valves of the first valve-comprising device that are associated with pumping stages other than the first pumping stage and to open the solenoid valve of the first valve-comprising device of the first pumping stage when the processing chamber is in vacuum limit operation.

11. A method for pumping a processing chamber by means of a pumping device according to claim 1, connected to a processing chamber, characterized in that the gas supply to the purging means of the dry primary vacuum pump is decreased and the pressure in the exhaust duct connected to the outlet of the dry primary vacuum pump is reduced by starting up the ejector when the processing chamber is in vacuum limit operation, the means for injecting motive gas of the ejector being supplied with gas from the purging means of the dry primary vacuum pump.

12. A pumping method according to claim 11, characterized in that the ejector is started up only when the processing chamber is in vacuum limit operation.

13. A pumping method according to claim 11, characterized in that when the processing chamber is in vacuum limit operation, the flow rate of the gas supply to the purging means is between 20 and 200 sccm.

* * * * *